US012267017B2

(12) United States Patent
Lanneluc et al.

(10) Patent No.: US 12,267,017 B2
(45) Date of Patent: Apr. 1, 2025

(54) DEVICE AND METHOD FOR MONITORING AN ELECTRICAL ENERGY CONVERTER, RELATED ELECTRICAL ENERGY CONVERSION SYSTEM

(71) Applicant: Commissariat à l'énergie atomique et aux énergies alternatives, Paris (FR)

(72) Inventors: Charley Lanneluc, Grenoble (FR); Pierre Perichon, Grenoble (FR); Eric Fernandez, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 197 days.

(21) Appl. No.: 18/065,326

(22) Filed: Dec. 13, 2022

(65) Prior Publication Data

US 2023/0188041 A1 Jun. 15, 2023

(30) Foreign Application Priority Data

Dec. 15, 2021 (FR) ...................... 21 13576

(51) Int. Cl.
*H02M 3/158* (2006.01)
*G01R 19/00* (2006.01)
(Continued)

(52) U.S. Cl.
CPC ...... *H02M 3/1584* (2013.01); *G01R 19/0092* (2013.01); *H10D 8/022* (2025.01); *H10D 8/25* (2025.01); *H02M 1/0009* (2021.05)

(58) Field of Classification Search
CPC ........................... H02M 3/158; H02M 1/0009
See application file for complete search history.

(56) References Cited

U.S. PATENT DOCUMENTS 10,158,291 B1 12/2018 Cinagrossi et al.
11,490,478 B1 * 11/2022 Lu ...................... H05B 45/37
(Continued)

FOREIGN PATENT DOCUMENTS

CN 204168124 U * 2/2015 ............ H02M 1/44
CN 104953846 A * 9/2015
(Continued)

OTHER PUBLICATIONS

French Preliminary Search Report issued Jul. 29, 2022 in French Application 21 13576, filed on Dec. 15, 2021 (with English Translation of Categories of cited documents), 4 pages.
(Continued)

*Primary Examiner* — Sisay G Tiku
(74) *Attorney, Agent, or Firm* — Oblon, McClelland, Maier & Neustadt, L.L.P.

(57) ABSTRACT

The monitoring device is configured for monitoring a converter comprising a first and a second input terminals, two output terminals, a first filter branch connected between the input terminals, a second filter branch connected in parallel with the first branch, two switching branches connected in parallel with the second branch, each switching branch including two switching half-branches connected in series and in an intermediate point forming an output terminal.
The monitoring device comprises a detection impedance configured for being connected between the first and the second branches, and a detection module configured for comparing the voltage across the detection impedance with a predefined threshold, then for generating a detection signal as soon as said voltage is greater than said threshold.

16 Claims, 6 Drawing Sheets

(51) Int. Cl.
H02M 1/00 (2007.01)
H10D 8/01 (2025.01)
H10D 8/25 (2025.01)

(56) References Cited

U.S. PATENT DOCUMENTS

| | | | |
|---|---|---|---|
| 11,528,793 B1* | 12/2022 | Lu | H05B 47/10 |
| 2006/0285366 A1* | 12/2006 | Radecker | H02M 3/33507 |
| | | | 363/16 |
| 2016/0061871 A1* | 3/2016 | Stahl | G01R 29/26 |
| | | | 324/613 |
| 2017/0214328 A1* | 7/2017 | Zhu | H05B 45/382 |
| 2017/0373602 A1* | 12/2017 | Lian | H02M 3/3387 |
| 2019/0146020 A1 | 5/2019 | Banerji et al. | |
| 2019/0277897 A1 | 9/2019 | Banerji et al. | |
| 2020/0333390 A1 | 10/2020 | Banerji et al. | |

FOREIGN PATENT DOCUMENTS

| | | | | |
|---|---|---|---|---|
| CN | 105450000 A | * | 3/2016 | |
| CN | 206962732 U | * | 2/2018 | H02M 3/33561 |
| CN | 208754178 U | * | 4/2019 | H02M 1/126 |
| CN | 111181410 A | * | 5/2020 | |
| CN | 111262441 A | * | 6/2020 | |
| CN | 112928927 A | * | 6/2021 | |
| CN | 111313708 B | * | 7/2021 | H02M 3/24 |
| CN | 220457296 U | * | 2/2024 | |
| DE | 102019002137 A1 | * | 6/2020 | H02M 1/0085 |
| EP | 2858222 A2 | * | 4/2015 | H02M 1/42 |
| EP | 2 899 886 A1 | | 7/2015 | |
| KR | 101908675 B1 | * | 10/2016 | |

OTHER PUBLICATIONS

Person, J. et al. "Short Circuit Detection Methods for Silicon Carbide (SiC) Power Semiconductors" PCIM Europe 2019. (7 pages).

Laumen, M. et al. "Ultra-Fast Short-Circuit Detection for SiC-MOSFETs Using DC-Link Voltage Monitoring" IEEE 11$^{th}$ International Symposium on Power Electronics for Distributed Generation Systems (PEDG) 2020. (7 pages).

Oinonen, M. et al. "Current measurement and short-circuit protection of an IGBT based on module parasitics" 2014 16$^{th}$ European Conference on Power Electronics and Applications, IEEE. (9 pages).

* cited by examiner

DEVICE AND METHOD FOR MONITORING AN ELECTRICAL ENERGY CONVERTER, RELATED ELECTRICAL ENERGY CONVERSION SYSTEM

CROSS-REFERENCE TO RELATED APPLICATIONS

This application is a U.S. non-provisional application claiming the benefit of French Application No. 21 13576, filed on Dec. 15, 2021, which is incorporated herein by reference in its entirety.

FIELD

The present invention relates to a device for monitoring an electrical energy converter.

The electrical energy converter is adapted to convert an input voltage into an output voltage and comprises a first and a second input terminals adapted to receive the input voltage, at least two output terminals adapted to deliver the output voltage, a first filter branch connected between the input terminals, a second filter branch connected in parallel with the first filter branch, at least two switching branches connected in parallel with the second filter branch, each filter branch including a capacitor, each switching branch including two switches connected at a midpoint, the midpoint of each switching branch then forming a respective output terminal.

The invention further relates to an electrical energy conversion system comprising such an electrical energy converter and such a device for monitoring the electrical energy converter.

The invention further relates to a method for monitoring such an electrical energy converter.

The invention further relates to the use of such a monitoring device for monitoring such an electrical energy converter.

The invention relates to the field of electronic systems for converting electrical energy, in particular systems for converting into alternating electrical energy, in particular DC-AC conversion systems, also called inverters or DC-AC (Direct Current-Alternating current) conversion systems. Such conversion systems are used in particular for powering electric motors.

BACKGROUND

New generation power components made of wide-bandgap semiconductor materials, are increasingly used. Such wide-bandgap materials are materials the band gap width of which, between the valence band and the conduction band, is greater than the band gap of silicon the physical limits of which are reached.

Among the wide-bandgap materials, silicon carbide, also denoted by SiC, and then gallium nitride, also denoted by GaN, are currently the most widely used to produce the new generation power components, such as controllable switches, in particular transistors. The high-performance characteristics of the new components, namely low resistance in the on-state, high switching speed and high temperature resistance, make it possible to considerably improve the performance of the converters, in terms of efficiency, bulk and cost.

However, such components made of wide-bandgap materials require optimized integration within the energy conversion system, and a special monitoring due to the specific features thereof, for the safety of users and the protection of the electronic components of the conversion system.

For the monitoring of electrical energy converters, a detection by current measurement is then known, consisting of measuring the current in the switching branch using a shunt or Rogowski current sensor.

However, such a current measurement is invasive for the shunt, and limited in terms of reaction speed for Rogowski current sensors, and is thus not suitable for such monitoring, in particular when the converter includes components made of wide-bandgap materials, more particularly for gallium nitride components.

Monitoring of the energy converter is also known by detecting desaturation in a component, via a measurement at the terminals of the component in order to detect such desaturation.

However, such a measurement has to maintain the high voltage at the terminals of the component, and can disturb the operation of the fast components, with additional parasitic capacitances.

The article "*New Ultra-Fast Short-Circuit Detection Method Without Using the Desaturation Process of the Power Semiconductor*" by S. Hain et al describes a rapid detection of the short-circuit regime without using a desaturation of power components. Such detection is performed via a parasitic inductance connected in series with the monitored power component and a detection circuit associated with such impedance.

However, such a detection is invasive in the control loop of the component and involves parasitic inductances of fairly high values (on the order of 10 to 20 nH), or even overvoltages between the drain and source electrodes, going as far as destroying the component.

The article "*Short-circuit Detection Methods for Silicon Carbide (SiC) Power Semiconductors*" by J. Person et al describes a detection similar to the detection discussed in the aforementioned article, via a parasitic inductance connected in series with the monitored power component; and a detection via a detection circuit connected to a control circuit of the monitored power component.

However, such a detection circuit requires high-blocking voltages to be maintained and involves a low breakdown voltage detection.

SUMMARY

The purpose of the invention is then to propose a device and a method for monitoring an electrical energy converter for an improved monitoring of the converter, in particular when the converter comprises switches made of wide-bandgap semiconductor material.

To this end, the subject matter of the invention is an electronic device for monitoring an electrical energy converter, the electrical energy converter being adapted to convert an input voltage into an output voltage and comprising a first and a second input terminals adapted to receive the input voltage, at least two output terminals adapted to deliver the output voltage, a first filter branch connected between the input terminals, a second filter branch connected in parallel with the first filter branch, at least two switching branches connected in parallel with the second filter branch, each filter branch including a capacitor, each switching branch including two switching half-branches connected in an intermediate point, the intermediate point of each switching branch then forming a respective output terminal, each half-branch including a least one switch, the monitoring device comprising a detection impedance configured for being connected between the first and the second filter branches, and a detection module configured for comparing the voltage across the detection impedance with a predefined voltage threshold, then for generating a detection signal as soon as the voltage across the detection impedance is greater than the predefined voltage threshold.

With the monitoring device according to the invention, the connection of the detection impedance between the first and the second filter branches can be used for detecting the occurrence of a short-circuit in a respective switching branch, with less interference with the operation of the converter during normal operation, compared with prior art monitoring devices where the detection impedance is generally arranged in the switching branch to be monitored. Compared with prior art monitoring devices, in this way it is further possible to dispense with transient currents during the switching of the switches (e.g., charging and discharging parasitic drain-source capacitances of the switches). Such currents are fast and intense and thus resemble short-circuits, but unlike the latter, do not last long.

The detection module can then be used for detecting the occurrence of a short-circuit in the switching branch by comparing the voltage across the detection impedance with the predefined voltage threshold.

Preferentially, the or each detection impedance is an inductance, and the voltage across said detection inductance is then $L \cdot di/dt$, where L represents the value of the inductance, and $di/dt$ represents the time derivative of the current, the time derivative of the current being typically high when the short-circuit occurs, due to a rapid variation of the current, in particular when the switches of the switching branch are made of a wide-bandgap semiconductor material. The voltage across the detection inductor is then sufficiently high for an easy and efficient detection of the occurrence of the short-circuit.

According to other advantageous aspects of the invention, the monitoring electronic device comprises one or a plurality of the following features, taken individually or according to all technically possible combinations:

- each filter branch has a first end connected to the first input terminal and a second end connected to the second input terminal; and the detection impedance includes at least one of a first impedance configured for being connected between said first ends and a second impedance configured for being connected between said second ends;
- the or each impedance is an inductance;
- the inductance is preferentially a parasitic inductance associated with a connection link between the first and the second filter branches;
- the detection impedance has an inductance value between 10 nH and 100 nH;
- the or each impedance is a resistor;
- the detection module includes a rectifier stage, a stage for protection against an overvoltage, a stage for detecting the crossing of a predefined voltage threshold, and a stage for protection against an overcurrent;
- the rectifier stage, the stage for protection against the overvoltage, the stage for detecting the crossing of the predefined voltage threshold, and the stage for protection against the overcurrent are connected successively one after the other;
- the stage for detecting the crossing is formed by a Zener diode with a breakdown voltage equal to the predefined voltage threshold;
- the detection module includes an optocoupler configured for generating the detection signal, the optocoupler being connected to the stage for detecting the crossing;
- the stage for protection against the overcurrent is connected between the stage for detecting the crossing and the optocoupler;

A further subject matter is an electrical energy conversion system, comprising an electrical energy converter adapted to convert an input voltage into an output voltage and a device for monitoring the electrical energy converter, the converter comprising a first and a second input terminals adapted to receive the input voltage, at least two output terminals adapted to deliver the output voltage, a first filter branch connected between the input terminals, a second filter branch connected in parallel with the first filter branch, at least two switching branches connected in parallel with the second filter branch, each filter branch including a capacitor, each switching branch including two switches connected at a midpoint, the midpoint of each switching branch then forming a respective output terminal, each half-branch including at least one switch, the monitoring device being as defined hereinabove, and the detection impedance is connected between the first and the second filter branches.

According to other advantageous aspects of the invention, the electrical energy conversion system comprises one or a plurality of the following features, taken individually or according to all technically possible combinations:

- each switch has a semiconductor switching component, such as a transistor;
- each semiconductor switching component is made of a material selected from the group consisting of: gallium nitride, silicon carbide and silicon; and
- each semiconductor switching component is made of a wide-bandgap semiconductor material, such as gallium nitride or silicon carbide.

A further subject matter of the invention is a method for monitoring an electrical energy converter, the electrical energy converter being adapted to convert an input voltage into an output voltage and comprising a first and a second input terminals adapted to receive the input voltage, at least two output terminals adapted to deliver the output voltage, a first filter branch connected between the input terminals, a second filter branch connected in parallel with the first filter branch, at least two switching branches connected in parallel with the second filter branch, each filter branch including a capacitor, each switching branch including two switching half-branches connected at an intermediate point, the intermediate point of each switching branch then forming a respective output terminal, each half-branch including a least one switch, the method comprising the following steps:
- connecting a detection impedance between the first and the second filter branches;
- comparing the voltage across the detection impedance with a predefined voltage threshold; and
- generating a detection signal as soon as the voltage across the detection impedance is higher than the predefined voltage threshold.

A further subject matter of the invention is a use of an electronic monitoring device for monitoring an electrical energy converter, the electrical energy converter being adapted to convert an input voltage into an output voltage and comprising a first and a second input terminals adapted to receive the input voltage, at least two output terminals adapted to deliver the output voltage, a first filter branch connected between the input terminals, a second filter branch connected in parallel with the first filter branch, at least two switching branches connected in parallel with the second filter branch, each filter branch including a capacitor, each switching branch including two switching half-branches connected at an intermediate point, the intermediate point of each switching branch then forming a respective output terminal, each half-branch including a least one switch, and when in use, the monitoring device comprises a detection impedance connected between the first and the second filter branches, and a detection module configured for comparing the voltage across the detection impedance with a predefined voltage threshold, then for generating a detection signal as soon as the voltage across the detection impedance is greater than the predefined voltage threshold.

BRIEF DESCRIPTION OF THE DRAWINGS

Such features and advantages of the invention will become clearer upon reading the following description, given only as a non-limiting example, and made with reference to the enclosed drawings, wherein.

DETAILED DESCRIPTION

Figure 1:
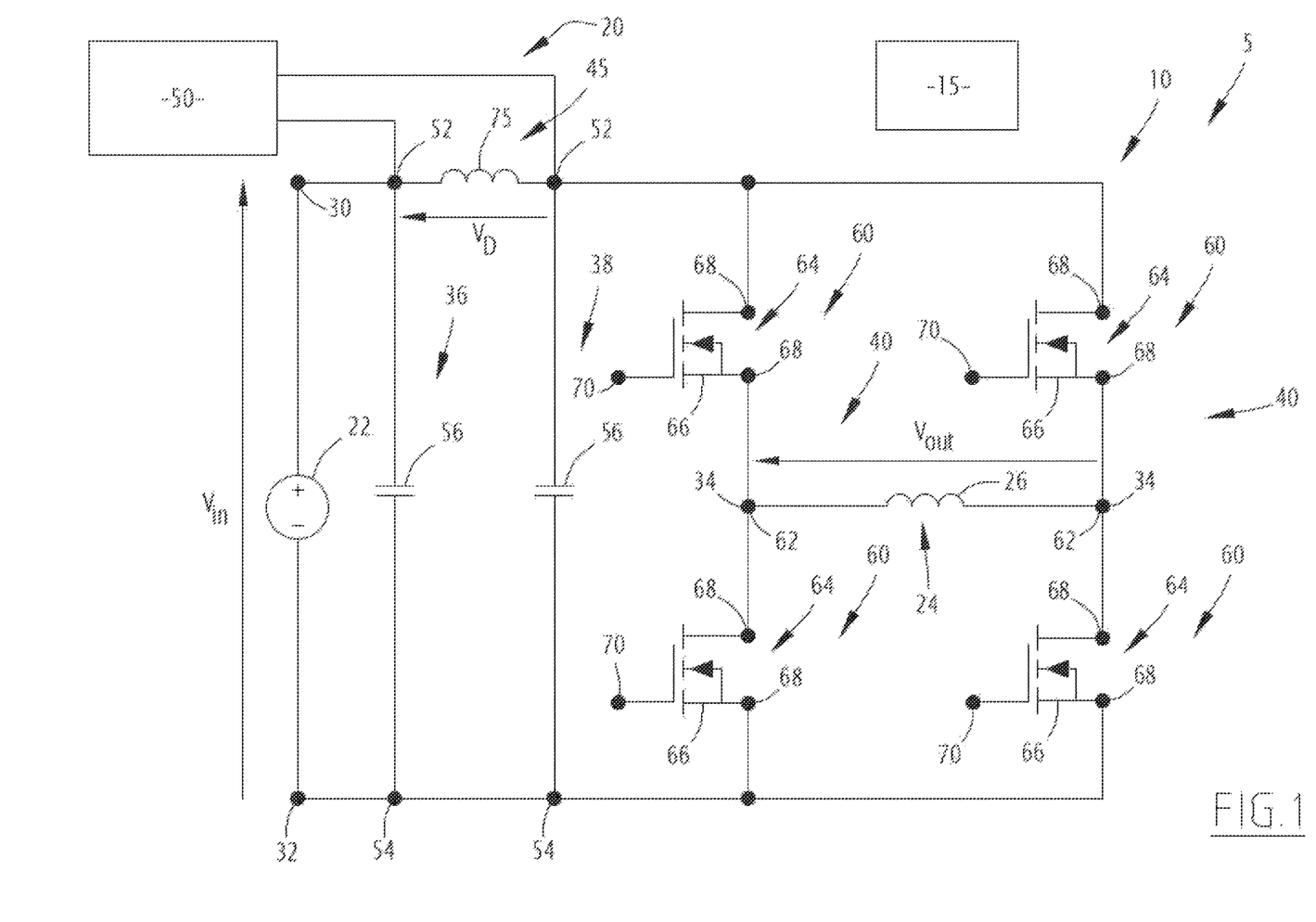
FIG. 1 is a schematic representation of an electrical energy conversion system according to the invention, the conversion system comprising an electrical energy converter, a control device for the electrical energy converter and a monitoring device for the electrical energy converter, the monitoring device including a detection impedance and a detection module adapted to compare the voltage across the detection impedance with a predefined voltage threshold and then to generate a detection signal if the threshold is crossed.

In FIG. 1, an electrical energy conversion system 5 comprises an electrical energy converter 10 adapted to convert an input voltage $V_{in}$ into an output voltage $V_{out}$, a device 15 for controlling the electrical energy converter 10, and a device 20 for monitoring said electrical energy converter 10.

The electrical energy conversion system 5 is then configured for converting an input energy, typically supplied by a source 22, into an output energy, typically consumed by a load 24, such as an electromagnetic coil 26 of an electric motor, not shown.

In addition, the conversion system 5 is a reversible conversion system, and is then configured to convert the electrical energy of the output into the electrical energy of the input.

In the example shown in FIG. 1, the conversion system 5 is a direct current-alternating current conversion system, also called a DC-AC conversion system, configured for converting DC electrical energy into AC electrical energy.

Alternatively, the conversion system 5 is a direct-direct conversion system, also called DC-DC conversion system, and is then configured for converting a direct current electrical energy into another direct current electrical energy.

When the conversion system 5 is a direct current-alternating current conversion system, the converter 10 is also a direct current-alternating current converter, and the input voltage $V_{in}$ is then a DC voltage, the output voltage $V_{out}$ being an AC voltage. In such case, the converter 10 then forms a voltage inverter.

When, in a variant, the conversion system 5 is a DC-DC conversion system, then the converter 10 is also a DC-DC converter, and the input voltages $V_{in}$ and output voltages $V_{out}$ are then each a DC voltage. According to such variant, the converter 10 then forms a voltage chopper.

The converter 10 comprises two input terminals 30, 32, namely a first input terminal 30 and a second input terminal 32, adapted to receive the input voltage $V_{in}$ at least two output terminals 34 adapted to deliver the output voltage $V_{out}$, a first filter branch 36 connected between the input terminals 30, 32, a second filter branch 38 connected in parallel with the first filter branch 36, and at least two switching branches 40 connected in parallel with the second filter branch 38.

As is known per se, when the converter 10 is a DC-AC converter, same includes a switching branch 40 for each phase of the output voltage $V_{out}$. A person skilled in the art will then observe e.g. that if the output voltage $V_{out}$ is a single-phase voltage, then the converter 10 includes two switching branches 40, and that if the output voltage $V_{out}$ is a three-phase voltage, then the converter includes three switching branches 40, with a connection, typically a star or delta connection, of the loads 24 between the midpoints of the switching branches 40.

In the example shown in FIG. 1, to keep the drawing simple, only two switching branches 40 are shown, and a person skilled in the art would understand that the example corresponds to the case of an alternating output voltage $V_{out}$, whatever the number of phases of the output voltage $V_{out}$.

The control device 15 is configured for controlling the converter 10. More precisely, the control device 15 is configured for controlling the switching branches 40, so as to convert the input voltage $V_{in}$ into the output voltage $V_{out}$.

The monitoring device 20 is configured for monitoring the converter 10, and in particular for detecting the occurrence of a possible short-circuit in a respective switching branch 40.

According to the invention, the monitoring device 20 comprises a detection impedance 45 configured for being connected between the first 36 and the second 38 filter branches, and a detection module 50 configured for comparing the voltage $V_D$ across the detection impedance 45 with a predefined voltage threshold S, then for generating a detection signal as soon as the voltage $V_D$ across the terminals of the detection impedance 45 is greater than the predefined voltage threshold S. In the example shown in FIG. 1, the detection impedance 45 is connected between the first filter branch 36 and the second filter branch 38 within the conversion system 5.

Each filter branch 36, 38 includes a first end 52 connected to the first input terminal 30, a second end 54 connected to the second input terminal 32, and a capacitor 56 connected between the first and the second ends 52, 54.

Each switching branch 40 includes two switching half-branches 60 connected in series and connected at an intermediate point 62, the intermediate point 62 of each switching branch 40 then forming a respective output terminal 34.

Each switching half-branch 60 includes at least one switch 64, each switch 64 being controllable by the control device 15. In the example shown in FIG. 1, each switching half-branch 60 includes only one switch 64. In a variant (not shown), each switching half-branch 60 includes a plurality of switches 64 connected in series. In this way it is possible to convert an electrical energy of higher voltage.

At least one switch 64 is e.g. a bidirectional current switch. Each switch 64 is preferentially a bidirectional current switch. Furthermore, if the converter 10 and in particular the switches 64 have to maintain both a positive voltage and a negative voltage, then at least one, and preferentially each switch 64 is a switch which is bidirectional with regard to both current and voltage.

When all the switches 64 are bidirectional with regard to current, the electrical energy converter 10 is a bidirectional converter configured for converting the input electrical energy into the output electrical energy if the current flows from the input terminals 30, 32 to the output terminals 34, and inversely configured for converting the output energy into the input energy if the current flows from the output terminals 34 to the input terminals 30, 32.

Such reverse operation of the electrical energy converter 10 to convert the output electrical energy into the input electrical energy is particularly useful for recovering energy, typically when the conversion system 5 is on board an electric transport vehicle, the energy being then recovered during a braking of said vehicle.

Each switch 64 typically includes a controllable semiconductor switching component 66, such as a transistor. As is known per se, each controllable semiconductor switching component 66 includes two conduction electrodes 68 and a control electrode 70, each semiconductor switching component 66 then being controllable via the control electrode 70 thereof, between one of an on-state in which the current flows between the conduction electrodes 68, and an off-state in which the current does not flow between the conduction electrodes 68.

When, in addition, the switch 64 is a bidirectional current switch, same further comprises e.g. a diode, not shown, connected in antiparallel with the semiconductor switching component 66. The diode is then connected between the conduction electrodes 68. A person skilled in the art would observe that when switch 64 is made of gallium nitride, such a diode is not needed, a gallium nitride switch being naturally reversible with regard to current.

Each controllable semiconductor switching component 66, such as a transistor, is typically made respectively of gallium nitride, also denoted by GaN, or of silicon carbide, also denoted by SiC, or silicon also denoted by Si. Each semiconductor switching component 66 is preferentially made of gallium nitride or of silicon carbide.

When the switching semiconductor component 66 is a transistor, such as a MOSFET (Metal Oxide Semiconductor Field Effect Transistor), the conduction electrodes 68 are also called drain electrode and source electrode, respectively, and the control electrode 70 is also called the gate electrode.

The detection impedance 45 includes at least one impedance among a first impedance 75 configured for being connected between the first ends 52 and a second impedance (not shown) configured for being connected between the second ends 54.

In the example shown in FIG. 1, the monitoring device 20 includes only one impedance connected between respective ends 52, 54, namely the first impedance 75 connected between the first ends 52.

In a variant, the only impedance of the monitoring device 20 is the second impedance connected between the second ends 54.

In a further variant, the monitoring device 20 includes two detection impedances 45, namely the first impedance 75 connected between the first ends 52 and the second impedance connected between the second ends 54.

According to the variant wherein the detection impedance 45 includes two impedances, namely the first impedance 75 and the second impedance, a person skilled in the art would then understand that the voltage $V_D$ across the detection impedance 45 is the sum of the voltages across each of the first and the second impedances, and the detection module 50 then being connected to the terminals of each of the first and the second impedances.

The or each impedance is e.g. an inductance, and preferentially a parasitic inductance associated with a connection link between the first 36 and the second 38 filter branches. In other words, when the inductance is a parasitic inductance, the inductance is then the parasitic inductance of the respective connection link between the first 36 and the second 38 filter branches.

In the example shown in FIG. 1, the first impedance 75 is such a parasitic inductance and then corresponds to the parasitic inductance of the connection link between the first ends 52 of the first 36 and the second 38 filter branches.

When the impedance or each impedance is an inductance, the inductance value is comprised e.g. between 10 nH and 100 nH.

In a variant, the or each impedance is a resistor.

The detection module 50 is connected to the terminals of the detection impedance 45, and configured for detecting the potential occurrence of a short-circuit in one of the switching branches 40 by comparing the voltage $V_D$ across the terminals of the detection impedance 45 with the predefined voltage threshold S, then by generating a detection signal corresponding to the occurrence of such a short-circuit, as soon as the voltage $V_D$ across the detection impedance 45 is greater than the predefined voltage threshold S.

Figure 2:
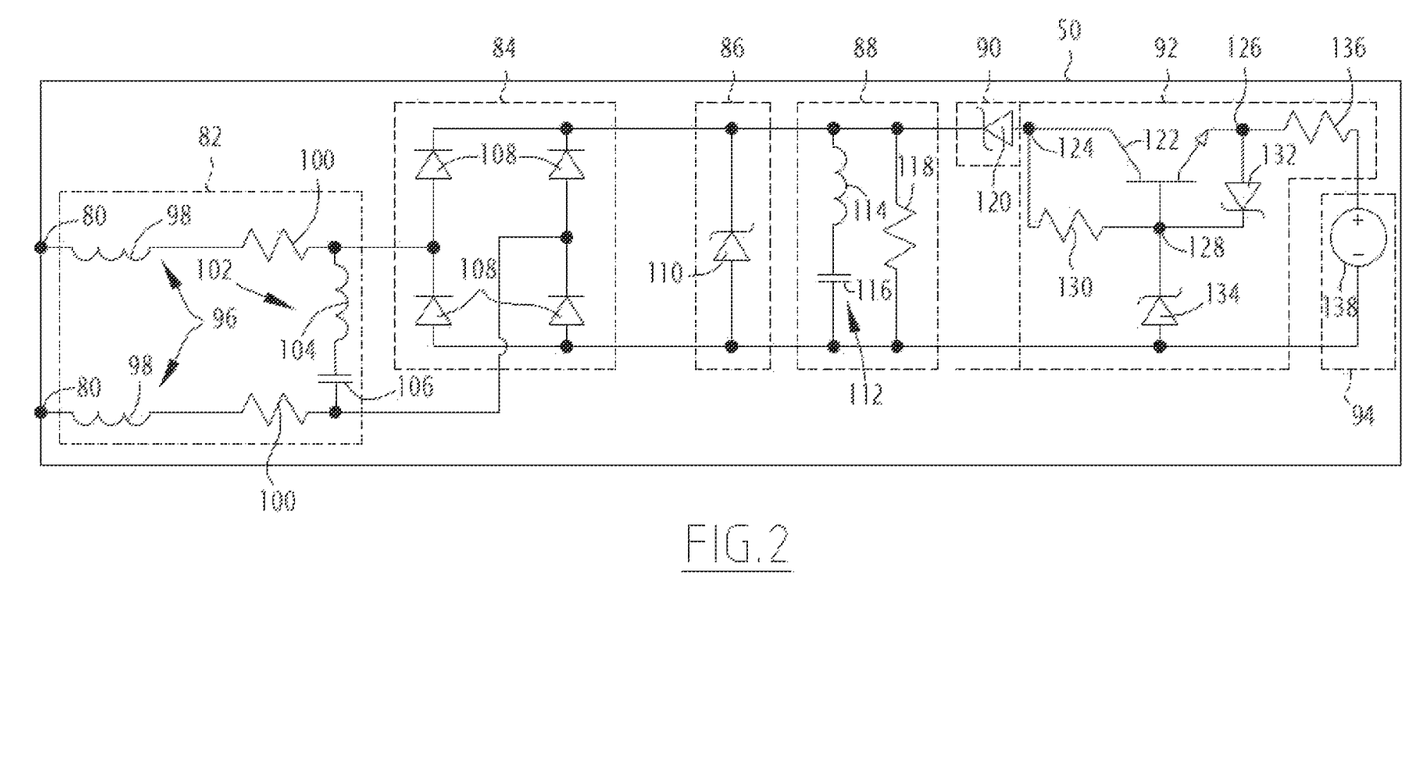
FIG. 2 is a schematic view of the detection module shown in FIG. 1.

In the example shown in FIG. 2, the detection module 50 includes two connection terminals 80 adapted to be connected to the terminals of the detection impedance 45, a filter stage 82; a rectifier stage 84; a stage 86 for protection against an overvoltage, also called protection against overvoltage 86; an envelope detection stage 88; a stage 90 for detecting the crossing of the predetermined voltage threshold S, also called detection of crossing stage 90; a stage 92 for protection against an overcurrent, also called protection against overcurrent stage 92; and a stage 94 for generating the detection signal, also called detection signal generation stage 94.

The filter 82, rectifier 84, protection against overvoltage 86, envelope detection 88, detection of crossing 90, protection against overcurrent 92 and detection signal generation 94 stages are preferentially connected successively one after the other. In the example shown in FIG. 2, the filter stage 82 is then connected to the connection terminals 80, the rectifier stage 84 is connected to the output of the filter stage 82, the stage of protection against overvoltage 86 is connected to the output of the rectifier stage 84, the envelope detection stage 88 is connected to the output of the stage of protection against overvoltage 86, the crossing detection stage 90 is connected to the output of the envelope detection stage 88, the overcurrent protection stage 92 is connected to the output of the crossing detection stage 90, and the generation stage 94 is connected to the output of the overcurrent protection stage 92.

A person skilled in the art would observe that, to compare the voltage $V_D$ across the detection impedance 45 with the predefined voltage threshold S, and then to generate the detection signal, only the stages for detecting the crossing 90 and for generating the detection signal 94 are needed, so that the other stages of the detection module 50, namely the filter stage 82, the rectifier stage 84, the protection stages 86, 92 and the envelope detection stage 88 are optional. Indeed, the filter stage 82 serves for carrying out an optional first order filtering, the rectifier stage 84 is used for converting the voltage $V_D$ across the detection impedance 45 into a DC voltage when the voltage $V_D$ is an AC voltage, the envelope detection stage 88 serves for storing a maximum value of the amplitude of the rectified voltage, i.e. of the direct current voltage, in order to improve the detection, the stage of protection against overvoltage 86 serves for protecting the downstream stages (i.e. the envelope detection 88, the detection of crossing 90, the protection against an overcurrent 92 and the generation 94 stages) against a possible overvoltage at the terminals of the detection impedance 45, and the overcurrent protection stage 92 serves for protecting the generation stage 94 against such an overcurrent.

In the example shown in FIG. 2, the filter stage 82 includes two filter arms 96, each being connected to a respective connection terminal 80 and including an electromagnetic coil 98 and a resistor 100 connected in series, as well as an LC arm 102 connected between the filter arms 96 and including an electromagnetic coil 104 and a capacitor 106 connected in series, the LC arm 102 being typically connected to the resistors 100 of each of the filter arms 96.

The rectifier stage 84 consists of a diode bridge 108, as is known per se.

The stage of protection against an overvoltage 86 includes a Zener diode 110 connected to the output of the rectifier stage 84, the Zener diode 110 preferentially being connected between the output terminals of the rectifier stage 84, adapted to deliver the DC voltage coming from said rectifier stage 84.

The envelope detection stage 88 comprises an LC arm 112 connected between the output terminals of the rectifier stage 84 forming terminals for applying the DC voltage, the LC arm consisting of an electromagnetic coil 114 and a capacitor 116 connected in series. In addition, the envelope detection stage 88 includes a resistor 118 connected in parallel with the LC arm 112.

The crossing detection stage 90 is connected to the positive potential of the DC voltage, i.e. to the positive terminal of application of the DC voltage, and consists e.g. of a Zener diode 120 the breakdown voltage of which is equal to the predefined voltage threshold S. The Zener diode 120 is connected by the cathode thereof to the positive output terminal of the rectifier stage 84, and by the anode thereof, to the overcurrent protection stage 92, connected to the output of the crossing detection stage 90.

The overcurrent protection stage 92 includes a transistor 122, such as a bipolar transistor, including a first conduction electrode 124 connected to the crossing detection stage 90, and in particular to the anode of the Zener diode 120, a second conduction electrode 126 and a control electrode 128. The overcurrent protection stage 92 further comprises a resistor 130 connected between the first conduction electrode 124 and the control electrode 128, a Zener diode 132 connected between the second conduction electrode 126 and the control electrode 128, the Zener diode 132 being preferentially connected by the cathode thereof to the control electrode 128 and by the anode thereof, to the second conduction electrode 126. The overcurrent protection stage 92 further comprises another Zener diode 134 connected by the cathode thereof to the control electrode 128 and by the anode thereof to the negative potential of the DC voltage, as well as a resistor 136 connected by one end to the second conduction electrode 126, and the other end of which is connected to the generation stage 94.

The generation stage 94 includes e.g. an optocoupler 138 adapted to generate the detection signal in the form of an optical signal, the optocoupler 138 being connected to the detection stage 90 via the overcurrent protection stage 92. In the example shown in FIG. 2, the optocoupler 138 is connected between the resistor 136 and the anode of the other Zener diode 134 of the overcurrent protection stage 92.

Figure 3:
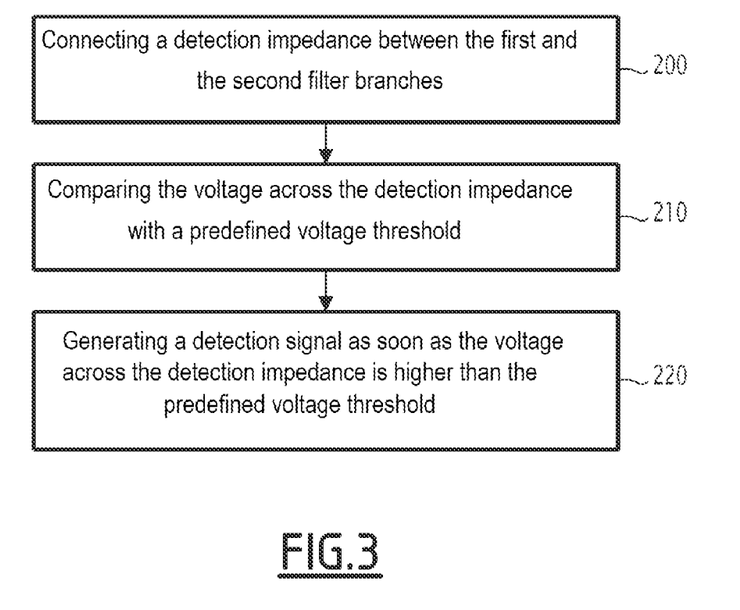
FIG. 3 is a flow chart of a monitoring method according to the electrical energy converter shown in FIG. 1.

The operation of the electrical energy conversion system 5, and in particular of the monitoring device 20 according to the invention, will now be explained with reference to FIG. 3 which represents a flow chart of the method for monitoring the electrical energy converter 10 according to the invention.

During an initial step 200, the detection impedance 45 is connected between the first 36 and the second 38 filter branches, and the detection module 50 is then connected to the terminals of the detection impedance 45.

A person skilled in the art would understand that when the detection impedance 45 is in the form of a parasitic impedance, such as a parasitic inductance, associated with the connection link between the first 36 and the second 38 filter branches, then, the detection impedance 45 does not, strictly speaking, need to be connected between the first 36 and the second 38 filter branches, the detection impedance 45 then being inherent to the connection link already present between the first 36 and the second 38 filter branches. However, in such case, the connection link between the first 36 and the second 38 filter branches requires to be dimensioned for having the desired parasitic impedance, such as a parasitic impedance with a value between 10 nH and 100 nH.

During a next step 210, the monitoring device 20 then compares the voltage $V_D$ across the detection impedance 45 with the predefined voltage threshold S. The comparison of the voltage $V_D$ with the predefined voltage threshold S is performed in particular by the detection module 50, and typically via the crossing detection stage 90.

Figure 4:
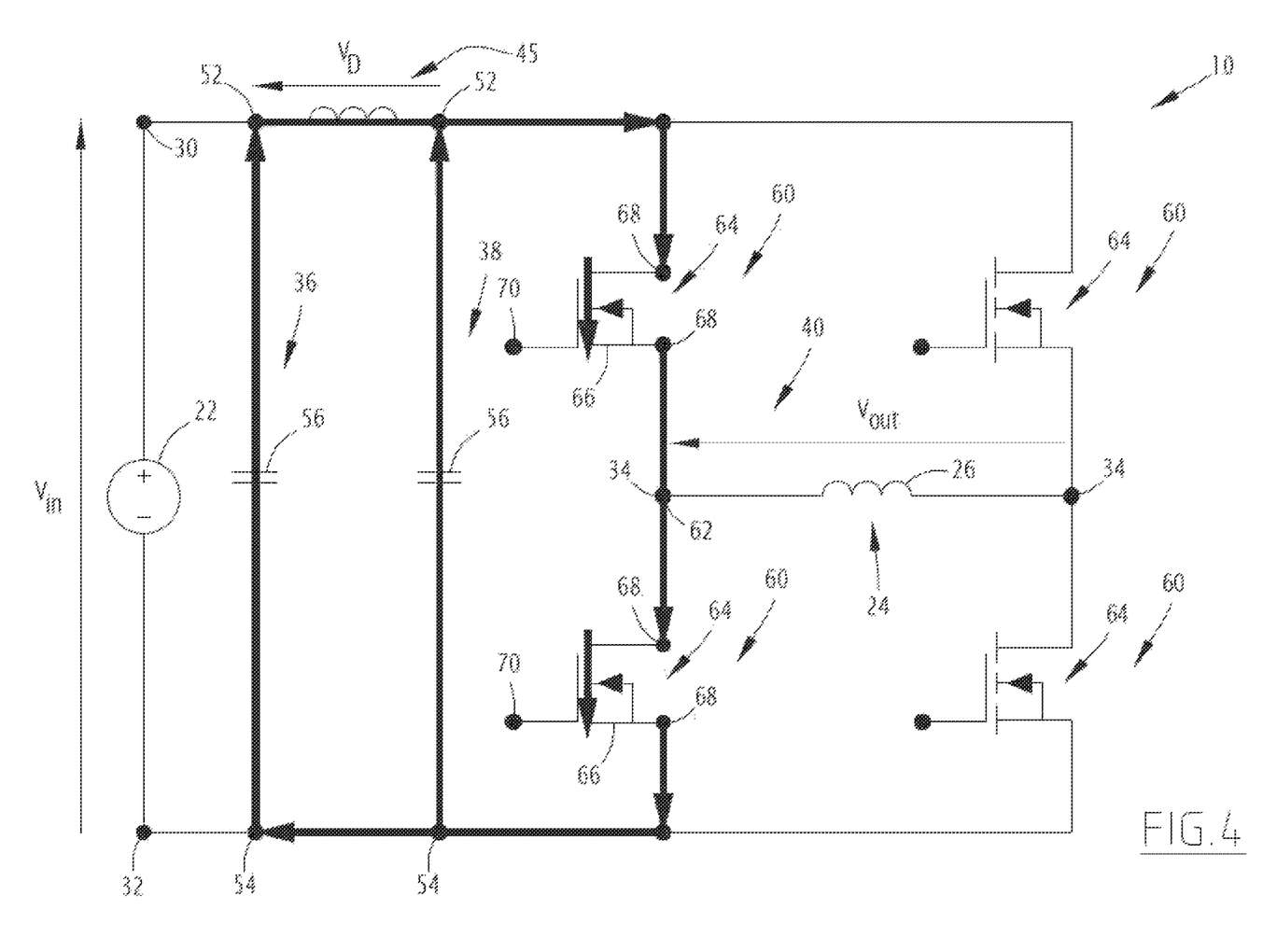
FIG. 4 is a view similar to that of FIG. 1, further illustrating the occurrence of a short-circuit in a switching branch of the electrical energy converter.

When a short-circuit occurs in one of the switching branches 40, i.e. when the two switching half-branches 60 of the same switching branch 40 allow current flow at the same time, as shown in FIG. 4 where the bold arrows symbolize the current flow, the voltage $V_D$ across the detection impedance 45 increases abruptly. Under a normal operation of the converter 10, only one of the two half-branches 60 of the same switching branch 40 allows current flow at a time; i.e., for each switching branch 40, only one half-branch 60 allows current flow at each instant.

Figure 5:
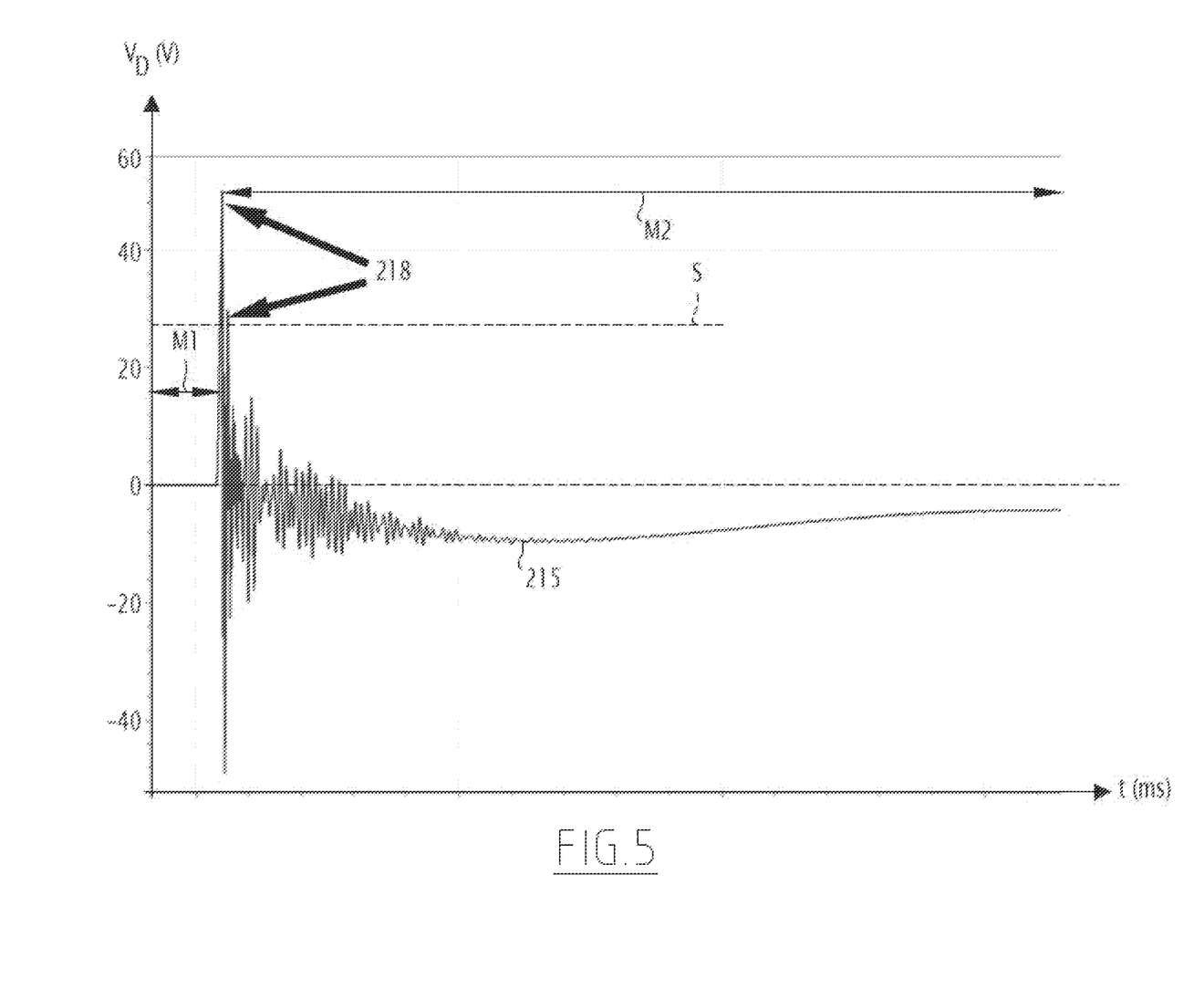
FIG. 5 is a curve representing the evolution as a function of time, of the voltage across the detection impedance of FIG. 1.

Such sudden change in the voltage $V_D$ across the detection impedance 45 can be seen in FIG. 5 where a curve 215 represents the time evolution of said voltage Vo. The curve 215 then shows a plurality of voltage peaks 218 corresponding to the occurrence of the short-circuit in the converter 10, and in particular in at least one of the switching branches 40. The voltage peaks 218 mark the beginning of the short-circuit operation of the converter 10, represented by the arrow M2, following a normal operation of the converter 10 represented by the arrow M1. A person skilled in the art would then observe that during normal operation of the converter 10 (arrow M1), the voltage $V_D$ across the detection impedance 45 is low, and close to the zero voltage in the example shown in FIG. 5, then increases abruptly when the short-circuit occurs (beginning of the arrow M2) and then reaches the voltage peaks 218.

The voltage peaks 218 exceed the predefined detection threshold S, and the voltage $V_D$ across the detection impedance 45 is then greater than said predefined voltage threshold S, e.g. equal to 27 volts in the example shown in FIG. 5.

As soon as the voltage $V_D$ across the detection impedance 45 is greater than the predefined voltage threshold S, the monitoring method then moves to the following step 220 during which the monitoring device 20 generates the detection signal in order to indicate that the voltage $V_D$ across the detection impedance 45 is greater than the predefined voltage threshold S, and that a short-circuit then probably occurred in the converter 10. The generation of the detection signal is performed by the detection module 50, and in particular by the generation stage 94, such as the optocoupler 138.

Figure 6:
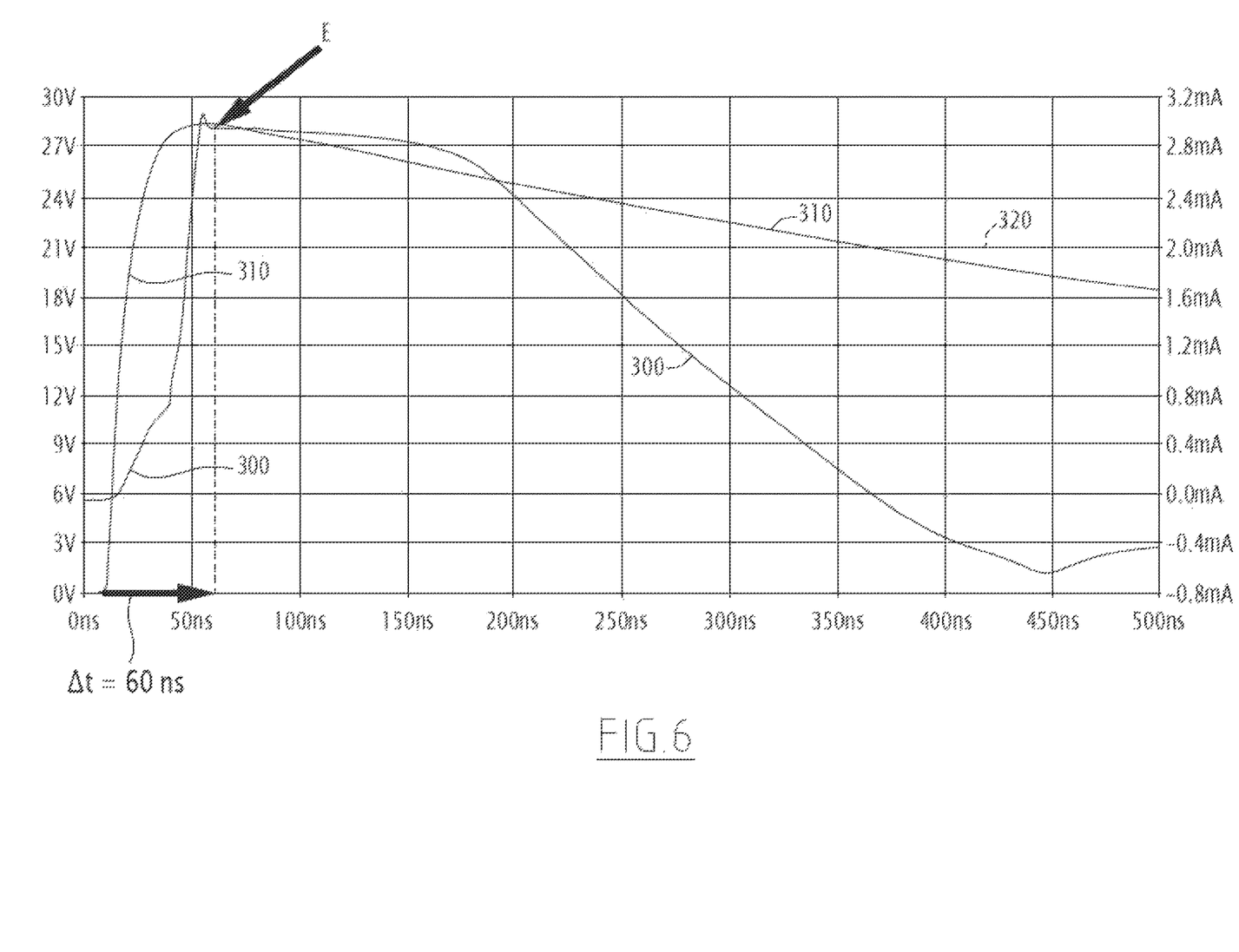
FIG. 6 is a set of curves illustrating the time required for the detection of the occurrence of a short-circuit, by the detection module shown in FIG. 1.

The detection by the detection module 50 is then particularly efficient and reactive, since the detection module 50 generates the detection signal in a period of time Δt on the order of 60 ns, as shown in FIG. 6, where the triggering instant of the optocoupler 138 represented by the arrow E, takes place approximately 60 ns after the occurrence of the short-circuit.

In the example shown in FIG. 6, the curve 300 represents the current flowing through the optocoupler 138, the curve 310 represents a generated voltage simulating a short-circuit, in order to validate the detection module 50, and the curve 320 represents a triggering threshold of the optocoupler 138, substantially equal to 2 mA.

A person skilled in the art would then notice that in FIG. 6, the instant of triggering of the optocoupler 138, represented by the vertical dotted line and the arrow E, is slightly offset in time with respect to the intersection of the curve 300 (representing the current through the optocoupler 138) with the section 320 (representing the triggering threshold of the optocoupler), and such slight time shift (on the order of 10 ns) is due to a propagation time inside the optocoupler 138 as such.

A person skilled in the art would also notice that the time during which the short-circuit voltage is greater than the voltage threshold S, substantially equal to 27 volts in the example shown in FIGS. 5 and 6, is relatively short, on the order of 100 ns (between the time instants 30 ns and 130 ns), which prevents untimely triggering of short-circuit detection, i.e. false alarms.

Furthermore, after detecting the short-circuit, the optocoupler 138 has sufficient time to generate the detection signal, since such generation is possible from the triggering of the optocoupler 138 represented by the arrow E and as long as the current flowing through the optocoupler 138 is greater than the triggering threshold, i.e. for more than 150 ns (between the time instants 60 ns and 225 ns).

The value of the detection impedance 45 typically depends on the material from which the semiconductor switching components 66 are made. When the detection impedance 45 is e.g. an inductance, the value of the inductance is on the order of a few tens of nH if the material of the semiconductor switching component 66 is gallium nitride (GaN), and on the order of a hundred nH if the material of the semiconductor switching component 66 is silicon carbide (SiC) or silicon (Si). Indeed, the switching time of the semiconductor switching component 66 is much shorter when said switching component 66 is made of gallium nitride, the switching time then typically being on the order of 10 ns, and when the switching component 66 is made of silicon carbide or silicon, the switching time is then on the order of 50 to 100 ns, which implies a detection inductance 5 to 10 times higher. Indeed, when the detection impedance 45 is an inductance, the voltage $V_D$ across said inductance is L·di/dt where L is the value of the detection inductance, and di/dt represents the time derivative of the current, i.e. the variation thereof with time. If a short-circuit occurs, the time delta dt thus corresponds substantially to the switching time of the semiconductor switching component 66, and a person skilled in the art would then notice that the faster said switching component 66 switches, the higher the voltage $V_D$ across the detection impedance 45 will be for the same impedance value. It is thus preferable to vary the value of the impedance depending on the material of the switching component 66, in order to have approximately the same voltage across the detection impedance 45, from one switching component technology 66 to another, and in particular to have substantially the same predefined detection threshold S whatever the material of the semiconductor switching component 66.

Thus, the monitoring device 20 and the monitoring method according to the invention can be used for quickly detecting the occurrence of a short-circuit in one of the switching branches 40 of the converter 10, since making the converter 10 safe requires approximately 100 to 200 ns from the occurrence of the short-circuit, the time between the 60 ns required for the detection of the short-circuit by the detection module 50 and the making safe corresponding to the signal generation time by the generation stage 94, such as the optical signal generation time by the optocoupler 138, followed by the time of processing the information by a microcontroller receiving said optical signal, and finally by the control time of the switches 64 of the converter 10 in the open position, for making said converter safe.

A person skilled in the art would observe that such speed of making safe is all the greater if the switches 64 include semiconductor switching components 66 made of gallium nitride, since the short-circuit time of the semiconductor switching component 66 is on the order of 1 μs when the switching component 66 is made of gallium nitride, and on the order of 10 μs when the latter is made of silicon, and on the order of 100 to 200 μs when the latter is made of silicon carbide. Such difference in short-circuit withstand according to the material of the semiconductor switching component 66 is linked to the energy withstand, under adiabatic conditions, of such components. Indeed, the energy withstand is on the order of 10 to 20 J/cm² for silicon carbide, on the order of 1 J/cm² for silicon, and on the order of 0.1 J/cm² for gallium nitride.

In addition, the capacitance of the capacitor 56, more particularly the capacitance of the second filter branch 38 as close as possible to the switching branches 40, is dimensioned so that the short-circuited switches 64 withstand the discharge energy of the corresponding filter branch 36, 38, more particularly of the second filter branch 38.

According to such addition, the capacitance of capacitor 56 must e.g. satisfy the following equation:

$$C < \frac{2 \cdot E_R}{V^2} \qquad [1]$$

where C is the capacitance of capacitor 56,
$E_R$ represents the energy withstand of the switch 64; and
V represents the voltage at the terminals of the corresponding filter branch 36, 38.

As an example, for an energy withstand $E_R$ of 0.1 J if the semiconductor switching component 66 is made of gallium nitride with a surface area of 1 cm², and a filter branch voltage of 400 V, the capacitance C of the capacitor 56 has to be lower, preferentially much less than 1.25 µF.

The monitoring device 20 and the monitoring method according to the invention can then be used for performing a very rapid detection of the occurrence of a short-circuit in the converter 10, without disturbing the operation of the converter 10 in nominal mode, when the latter is operating normally.

It is then understood that the monitoring device 20 and the monitoring method according to the invention can be used for an improved monitoring of the converter 10, in particular when the converter 10 includes switches 64 made of wide-bandgap semiconductor material.

The invention claimed is:

1. An electronic device for monitoring an electrical energy converter, the electrical energy converter being adapted to convert an input voltage into an output voltage and comprising a first and a second input terminals adapted to receive the input voltage, at least two output terminals adapted to deliver the output voltage, a first filter branch connected between the input terminals, a second filter branch connected in parallel with the first filter branch, at least two switching branches connected in parallel with the second filter branch, each of the filter branches including a capacitor, each of the switching branches including two switching half-branches connected in series and in an intermediate point, the intermediate point of each switching branch then forming a respective output terminal, each half-branch including at least one switch, wherein the monitoring device comprises a detection impedance configured for being connected between the first and the second filter branches, and a detection module configured for comparing a voltage across the detection impedance with a predefined voltage threshold, then for generating a detection signal as soon as the voltage across the detection impedance is greater than the predefined voltage threshold, and wherein a first terminal of the detection module is coupled to a common node of a first leg of the detection impedance and the first filter branch and a second terminal of the detection module is coupled to a common node of a second leg of the detection impedance and the second filter branch.

2. The device according to claim 1, wherein each of the filter branches has a first end connected to the first input terminal and a second end connected to the second input terminal, and wherein the detection impedance includes at least one of a first impedance configured for being connected between said first ends and a second impedance configured for being connected between said second ends.

3. The device according to claim 1, wherein the detection impedance is an inductance.

4. The device according to claim 3, wherein the inductance is a parasitic inductance associated with a connection link between the first and the second filter branches.

5. The device according to claim 3, wherein the detection impedance has an inductance value comprised between 10 nH and 100 nH.

6. The device according to claim 1, wherein the detection module includes a rectifier stage, a stage for protection against an overvoltage, a stage for detecting the crossing of a predefined voltage threshold, and a stage for protection against an overcurrent.

7. The device according to claim 6, wherein the rectifier stage, the stage for protection against the overvoltage, the stage for detecting the crossing, and the stage for protection against the overcurrent are connected successively one after the other.

8. The device according to claim 6, wherein the stage for detecting the crossing consists of a Zener diode with a breakdown voltage equal to the predefined voltage threshold.

9. The device according to claim 1, wherein the detection module includes an optocoupler configured for generating the detection signal, the optocoupler being connected to the stage for detecting the crossing.

10. The device according to claim 9, wherein the stage for protection against the overcurrent is connected between the stage for detecting the crossing and the optocoupler.

11. An electrical energy conversion system, comprising an electrical energy converter adapted to convert an input voltage into an output voltage and a monitoring device for the electrical energy converter, the converter comprising a first and a second input terminals adapted to receive the input voltage, at least two output terminals adapted to deliver the output voltage, a first filter branch connected between the input terminals, a second filter branch connected in parallel with the first filter branch, at least two switching branches connected in parallel with the second filter branch, each of the filter branches including a capacitor, each of the switching branches including two switching half-branches connected at an intermediate point, the intermediate point of each switching branch then forming a respective output terminal, each half-branch including a least one switch, wherein the monitoring device is according to claim 1, and the detection impedance is connected between the first and the second filter branches.

12. The system according to claim 11, wherein each second switch includes a switching semiconductor component.

13. The system according to claim 12, wherein the semiconductor switching component is a transistor.

14. The system according to claim 12, wherein the semiconductor switching component is made of a material selected from a group consisting of: gallium nitride, silicon carbide and silicon.

15. The system according to claim 12, wherein the semiconductor switching component is made of a wide-bandgap semiconductor material.

16. A method of monitoring an electrical energy converter, the electrical energy converter being adapted to convert an input voltage into an output voltage and comprising a first and a second input terminals adapted to receive the input voltage, at least two output terminals adapted to deliver the output voltage, a first filter branch connected between the input terminals, a second filter branch connected in parallel with the first filter branch, at least two switching branches connected in parallel with the second filter branch, each of the filter branches including a capacitor, each of the switching branches including two switching half-branches connected in series in an intermediate point, the intermediate point of each switching branch then forming a respective output terminal, each half-branch including at least one switch, the method comprising the following steps:
    connecting a detection impedance between the first and the second filter branches;

comparing, with a detection module, a voltage across the detection impedance with a predefined voltage threshold; and generating, with the detection module, a detection signal as soon as the voltage across the detection impedance is higher than the predefined voltage threshold, and wherein a first terminal of the detection module is coupled to a common node of a first leg of the detection impedance and the first filter branch and a second terminal of the detection module is coupled to a common node of a second leg of the detection impedance and the second filter branch.

* * * * *